United States Patent
Akiyama et al.

(10) Patent No.: US 7,365,115 B2
(45) Date of Patent: Apr. 29, 2008

(54) COMPOSITION FOR ANTIREFLECTION COATING AND METHOD FOR FORMING PATTERN

(75) Inventors: Yasushi Akiyama, Ogasa-gun (JP); Yusuke Takano, Ogasa-gun (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/519,242

(22) PCT Filed: Jun. 26, 2003

(86) PCT No.: PCT/JP03/08087

§ 371 (c)(1), (2), (4) Date: Dec. 22, 2004

(87) PCT Pub. No.: WO2004/006023

PCT Pub. Date: Jan. 15, 2004

(65) Prior Publication Data

US 2005/0239932 A1    Oct. 27, 2005

(30) Foreign Application Priority Data

Jul. 4, 2002   (JP) ............................. 2002-195582

(51) Int. Cl.
G03F 7/11     (2006.01)
G03F 7/00     (2006.01)
H01L 21/027   (2006.01)
C09D 129/10   (2006.01)
C09D 127/12   (2006.01)
C09D 133/16   (2006.01)

(52) U.S. Cl. ............... 524/236; 430/271.1; 430/270.1; 430/910; 430/327; 524/238; 524/319; 524/165; 526/206; 526/214; 526/225; 526/236

(58) Field of Classification Search ............... 524/236, 524/238, 319; 430/271.1, 910
See application file for complete search history.

(56) References Cited

U.S. PATENT DOCUMENTS

| | | | |
|---|---|---|---|
| 5,118,585 A | | 6/1992 | Schwaim et al. |
| 5,216,135 A | | 6/1993 | Urano et al. |
| 5,272,042 A | | 12/1993 | Allen et al. |
| 5,326,675 A | | 7/1994 | Niki et al. |
| 5,468,589 A | | 11/1995 | Urano et al. |
| 5,631,314 A | * | 5/1997 | Wakiya et al. ............... 524/165 |
| 5,814,694 A | * | 9/1998 | Watanabe et al. ........... 524/238 |
| 6,465,161 B1 | * | 10/2002 | Kang et al. .................. 430/327 |
| 6,692,892 B1 | * | 2/2004 | Takano et al. ........... 430/270.1 |
| 2004/0023156 A1 | * | 2/2004 | McGinness et al. ..... 430/271.1 |

FOREIGN PATENT DOCUMENTS

| | | |
|---|---|---|
| EP | 0 723 677 | 3/2000 |
| EP | 1 026 208 | 8/2000 |
| EP | 0 366 590 | 3/2001 |
| JP | 60-038821 | 2/1985 |
| JP | 60-263141 | 12/1985 |
| JP | 62-062520 | 3/1987 |
| JP | 62-062521 | 3/1987 |
| JP | 2-19847 | 1/1990 |
| JP | 2-209977 | 8/1990 |
| JP | 3-206458 | 9/1991 |
| JP | 4-211258 | 8/1992 |
| JP | 05-074700 | 3/1993 |
| JP | 05-088598 | 4/1993 |
| JP | 5-249682 | 9/1993 |
| JP | 06-118630 | 4/1994 |
| JP | 06-148896 | 5/1994 |
| JP | 07-234514 | 9/1995 |
| JP | 08-044066 | * 2/1996 |
| JP | 08-305032 | 11/1996 |
| JP | 09-050129 | 2/1997 |
| JP | 09-090615 | 4/1997 |
| JP | 09-236915 | 9/1997 |
| JP | 10-301268 | 11/1998 |
| JP | 11-124531 | * 5/1999 |
| JP | 11-124531 | * 11/1999 |
| JP | 2001-133984 | * 5/2001 |
| JP | 2002-227660 | 8/2002 |
| WO | WO 95/10798 | 4/1995 |

OTHER PUBLICATIONS

English Language Abstract of JP 2001-133984.
Office Action, and English Language Translation, for JP 2002-195582.

(Continued)

*Primary Examiner*—Duane Smith
*Assistant Examiner*—Ives Wu
(74) *Attorney, Agent, or Firm*—Sangya Jain

(57) ABSTRACT

An anti-reflective coating film is formed by applying on a chemically amplified photoresist film an anti-reflective coating composition comprising an alkali-soluble fluorine-containing polymer, an acid, an amine and a solvent capable of dissolving these components and having a pH of 7 or less. The formed anti-reflective coating film can serve to prevent multiple reflections within the photoresist film, increase the amount of reduction in thickness of the photoresist film upon development with a developer after exposure, and form a pattern having a rectangular cross-sectional pattern and not having T-top or round top.

11 Claims, No Drawings

OTHER PUBLICATIONS

Office Action for SG 200407376-3.
English Language abstract of JP 05-074700, Mar. 26, 1993.
English language abstract of JP 05-088598, Apr. 9, 1993.
English Language abstract of JP 06-118630, Apr. 1994.
English Language abstract of JP 06-148896, May 1994.
English Language abstract of JP 07-234514, Sep. 5, 1995.
English Language abstract of JP 08-044066, Feb. 16, 1996.
English Language abstract of JP 08-305032, Nov. 22, 1996.
English Language abstract of JP 09-050129, Feb. 18, 1997.
English Language abstract of JP 09-090615, Apr. 4, 1997.
English Language abstract of JP 09-236915, Sep. 9, 1997.
English Language abstract of JP 10-301268, Nov. 1998.
English Language abstract of JP 11-124531, May 1999.
English Language abstract of JP 60-038821, Feb. 28, 1985.
English Language abstract of JP 60-263141, Dec. 26, 1985.
English Language abstract of JP 62-062520, Mar. 19, 1987.
English Language abstract of JP 62-062521, Mar. 19, 1987.
English Language abstract of JP 2002-227660, Aug. 14, 2002.
Ito et al., "Chemical Amplification in the Design of Dry Developing Resist Materials", Polymer Engineering And Science vol. 23, No. 18, pp. 1012-1018 (1983).
Machine English Language Translation of JP 05-072700, Mar. 1993.
Machie English Language Translation of JP 05-088598, Apr. 1993.
Machine English Language Translation of JP 06-118630, Apr. 28, 1994.
Machine English Language Translation of JP 06-148896, May 1994.
Machine English Language Translation of JP 07-234514, Sep. 1995.
Machine English Language Translation of JP 08-044066, Feb. 1996.
Machine English Language Translation of JP 08-305032, Nov. 1995.
Machine English Language Translation of JP 09-050129, Feb. 1997.
Machine English Language Translation of JP 09-090615, Apr. 1997.
Machine English Language Translation of JP 10-301268, Nov. 1998.
Machine English Language Translation of JP 11-124531, May 1999.
English Language Abstract of JP 2001-133984, May 2001.
Office Action, and English Language Translation, for JP 2002-195582, Apr. 2002.
Office Action for SG 200407376-3, Mailing Date: Apr. 2006.

* cited by examiner

COMPOSITION FOR ANTIREFLECTION COATING AND METHOD FOR FORMING PATTERN

TECHNICAL FIELD

The present invention relates to an anti-reflective coating composition and a method for forming a pattern using the anti-reflective coating composition. More particularly, it relates to an anti-reflective coating composition capable of forming an anti-reflective coating which, in forming a pattern according to photolithographic technology using a photoresist, functions as an interference-preventing membrane for preventing deterioration of dimensional accuracy of the pattern (variation of dimensional width of the pattern) to be caused due to interference with a substrate-reflected light within the photoresist film and which is used for forming a resist pattern having no defects such as T-tops and round tops, and to a method for forming a pattern using the anti-reflective coating composition.

BACKGROUND ART

In manufacturing semiconductor elements, there has been applied a lithographic technology of forming a photoresist film on a substrate such as a silicon wafer, selectively irradiating the photoresist film with active light rays, and subjecting it to development processing to form thereby a resist pattern on the substrate.

In recent years, in order to obtain a higher degree of integration in LSI, reduction in the line width of worked wires in the lithography process has rapidly been promoted. In this promotion of reduction in the line width of worked wires, various proposals have been made with respect to all steps and all materials to be used for the lithography including photoresists, anti-reflective coatings, exposing methods, exposing apparatuses, developing agents, developing methods and developing apparatuses. For example, various proposals have been made as to the anti-reflective coating. JP-A-60-38821, JP-A-62-62520, JP-A-62-62521, JP-A-5-74700, JP-A-5-188598, JP-A-6-118630, JP-A-6-148896, JP-A-8-305032, JP-A-9-50129, JP-A-9-90615 and JP-A-11-124531 describe to provide a surface reflection-preventing layer having a low refractive index on a resist layer to thereby prevent reflection at the resist surface and detrimental influences by a reflected light on formation of a resist pattern. Formation of the anti-reflective coating on the resist layer serves to reduce fluctuation in sensitivity and therefore reduce dimensional fluctuation even when thickness of the resist layer fluctuates, because amplitude width in a resist film thickness vs. sensitivity curve is made smaller. In addition, use of the surface reflection-preventing film provides another advantage that unfavorable standing wave to be formed due to interference between an incident light and a reflected light or between reflected lights can be reduced.

Further, as to exposing methods, there have been proposed methods of using a light source emitting a light of short wavelength effective for forming a finer pattern, that is, methods of using a deep-UV rays such as KrF excimer laser (248 nm) or an ArF excimer laser (193 nm), or X rays or electron beams, as a light source for exposure, with part of them being put into practice. In the lithography process using such light source emitting the light of short wavelength, there have been proposed chemically amplified resists showing a high sensitivity for the energy rays of a short wavelength as disclosed in JP-A-2-209977, JP-A-2-19847, JP-A-3-206458, JP-A-4-211258 and JP-A-5-249682.

By the way, in order to obtain excellent anti-reflective properties, it is generally believed to be necessary to satisfy the conditions of the following formula 1 and formula 2:

$$n_{tarc} = \sqrt{n_{resist}} \quad (1)$$

wherein $n_{tarc}$ represents a refractive index of an anti-reflective coating, and $n_{resist}$ represents a refractive index of a resist;

$$d_{tarc} = x \cdot \lambda / 4 n_{tarc} \quad (2)$$

wherein $d_{tarc}$ represents a thickness of the anti-reflective coating, $\lambda$ represents a wavelength of energy rays, and x represents an odd integer.

As is apparent from these formulae, the anti-reflective ability is decided by the refractive index of an anti-reflective coating for the wavelength of a light emitted from an intended light source and the thickness of the anti-reflective coating and by the refractive index of a resist. The refractive index of the anti-reflective film is required to be at a low level in comparison with the refractive index of the resist so as to satisfy the above-described conditions.

On the other hand, compounds containing a fluorine atom show a low refractive index due to the characteristics of fluorine atom that fluorine atom has a large molecular volume and a small atomic refractive index, and the refractive index value of such compound is known to be almost proportional to the fluorine content of the compound. Therefore, fluorine-containing compounds are preferred compounds in view of attaining anti-reflecting properties. It is also known to use a fluorine-containing polymer as the fluorine-containing compound having a low refractive index for a material for forming an anti-reflecting coating of a resist layer. In addition to having a low refractive index, the material for the anti-reflective coating is required to have various properties such as coating properties, film-forming properties and developability with an aqueous solvent. For example, the above-mentioned JP-A-9-50129 and JP-A-11-124531 describes to provide, on a resist layer, a surface reflection-preventing layer containing a fluorine-containing polymer which is soluble in an alkaline aqueous solution and which has a low refractive index to prevent thereby detrimental influences of a reflected light from the resist surface on formation of the resist pattern and, upon developing with an alkaline developing solution, remove the anti-reflective coating together with the resist film. On the other hand, in the case where the above-mentioned fluorine-containing polymer is absent, the refractive index of the film increases and, thus, the standing wave effect and the multi-reflection effect are not sufficiently depressed and, as a result, dimensional accuracy of the resist is deteriorated.

However, in the case of applying, for example, a composition for an anti-reflective coating on a chemically amplified photoresist film, round-topped or T-topped resist patterns which cause troubles in the etching process might possibly be formed with an ill-matched combination of the composition and the chemically amplified photoresist. For example, the above-mentioned JP-A-11-124531 discloses a coating composition containing a fluorine-containing polymer and having a suitably low refractive index as an anti-reflective coating, as an anti-reflective coating composition to be applied on a photoresist film. However, in the case of using this anti-reflective coating composition in a process of using as an exposing light source a short-wavelength light source such as a KrF excimer laser (248 nm) and using a chemically amplified photoresist as a photoresist, there tends to result a developed resist pattern having a T-shaped cross section (T-top) in the case where the photoresist is positive-working.

Further, in recent years, PFAS (perfluoroalkyl sulfonates) having conventionally been used in a composition for anti-reflective coatings has become a subject of discussion with respect to its safety in view of accumulation in human body. For example, there is a movement of providing restrictions on import and production thereof by EPA (Environment Protection Agency) of USA through SNUR (Significant New Use Rule, dated Mar. 11, 2002). Under such circumstances, a PFAS-free composition for anti-reflective coating is being eagerly demanded.

With the above-mentioned background in mind, it is intended in the present invention to provide a method for forming a resist pattern not suffering deterioration of the pattern form such as T-tops and round tops disadvantageous in the etching step to be caused by, for example, intermixing of the chemically amplified resist and the anti-reflective film by forming an anti-reflective film which functions as an interference-preventing film for preventing deterioration of dimensional accuracy of a pattern (variation of dimensional width of the pattern) to be caused within the photoresist film due to interference with a reflected light from the substrate, and to provide a PFAS-free composition for the anti-reflective coating to be used in this method.

As a result of intensive investigations, the inventors have found that the above-described object can be attained by applying an anti-reflective coating composition containing a fluorine-containing polymer on, for example, a chemically amplified photoresist film formed on a substrate to make the surface hydrophilic, and then exposing and developing the photoresist to obtain a resist pattern, with pH of the anti-reflective coating composition being adjusted to 7 or less, thus having completed the invention.

DISCLOSURE OF THE INVENTION

The present invention relates to an anti-reflective coating composition of 7 or less in pH which comprises a fluorine-containing polymer, an acid, an amine and an aqueous solvent capable of dissolving these components.

Further, the present invention relates to the above-described anti-reflective coating composition wherein the fluorine-containing polymer is a fluorine-containing polymer containing a polymer unit represented by the following general formula (I) or a fluorine-containing polymer containing a polymer unit represented by the following general formula (I) and a polymer unit represented by the following general formula (II):

$$—[CF_2CF(OR_fCOOH)]— \quad (I)$$

wherein $R_f$ represents a straight or branched chain perfluoroalkyl group which may contain an etheric oxygen atom;

$$—[CF_2CFX]— \quad (II)$$

wherein X represents a fluorine atom or a chlorine atom.

Furthermore, the present invention relates to one of the above-described anti-reflective coating composition wherein the acid is at least one member selected from the group consisting of sulfuric acid, hydrochloric acid, nitric acid, phosphoric acid, hydrofluoric acid, hydrobromic acid, alkylsulfonic acid, alkylbenzenesulfonic acid, alkylcarboxylic acid, alkylbenzenecarboxylic acid, and those obtained by replacing all or part of the hydrogen atoms of the aforesaid alkyl group.

Additionally, the present invention relates to one of the above described anti-reflective coating compositions wherein the amine is at least one member selected from the group consisting of $NH_3$, $N(CH_3)_4OH$, alkanolamine, alkylamine and aromatic amine.

Further, the present invention relates to one of the above described anti-reflective coating compositions wherein the aqueous solvent is water.

Furthermore, the present invention relates to a pattern-forming method which includes a step of coating one of the above described anti-reflective coating compositions on a photoresist film and a optional heating step.

SPECIFIC EMBODIMENT OF THE INVENTION

The present invention is described in more detail below.

In the anti-reflective coating composition of the present invention are comprised a fluorine-containing polymer, an acid, an amine, and an aqueous solvent capable of dissolving these components. In addition, the acidic state of the anti-reflective coating composition is required to be 7 or less in pH. Particularly, in the case where the photoresist is a positive-working chemically amplified photoresist, the pH of the anti-reflective coating composition is in the range of preferably 1.0 to 6.0, more preferably 1.0 to 4.0, still more preferably 1.6 to 2.6.

As the fluorine-containing polymer to be used as a constituent of the anti-reflective coating composition of the present invention, any fluorine-containing resin that is soluble in an aqueous medium may be used. Of these polymers, a fluorine-containing polymer which has a carboxylic acid group in one of repeating units constituting the polymer is preferred. Examples of the fluorine-containing polymer soluble in an aqueous medium include fluorine-containing polymers containing the polymer unit represented by the aforementioned general formula (I) and fluorine-containing polymers containing the polymer units represented by the foregoing general formulae (I) and the polymer units represented by the general formula (II). Number-average molecular weight of the fluorine-containing polymer is preferably $1×10^3$ to $3×10^4$ as determined using polystyrene standards. In consideration of solubility in a solvent, coating properties of the resultant composition and thickness of the film to be formed, the content of the fluorine-containing polymer is preferably 0.1% by weight to 25% by weight, more preferably 1 to 10% by weight, still more preferably 2 to 4% by weight.

The acid to be used in the anti-reflective coating composition of the present invention may be an organic acid or an inorganic acid. Preferred examples of the organic acid include alkylsulfonic acids, alkylbenzenesulfonic acids, alkylcarboxylic acids, alkylbenzenecarboxylic acids, and those obtained by replacing all or part of the hydrogen atoms of the alkyl group described above with fluorine atoms. As the aforementioned alkyl group, those which contain 1 to 20 carbon atoms are preferred. These organic acids are used in an addition amount of usually 0.1% by weight to 2.0% by weight, preferably 0.5% by weight to 1.0% by weight, in the anti-reflective coating composition.

Preferred examples of the inorganic acid include sulfuric acid, hydrochloric acid, nitric acid, phosphoric acid, hydrofluoric acid and hydrobromic acid. These inorganic acids are added in order to reduce pH of the anti-reflective coating composition to 7 or less, and the amount thereof to be used is determined in connection with the amount of the amine to be described hereinafter, but is usually 0.01% by weight to 0.2% by weight based on the anti-reflective coating composition. These organic acids and the inorganic acids may be used alone or in combination of two or more thereof.

On the other hand, preferred examples of the amine to be used in the anti-reflective coating composition of the present invention include $NH_3$, $N(CH_3)_4OH$, alkanolamines, alkylamines and aromatic amines. These amines are introduced into the composition preferably as amine salts previously formed with, for example, carboxylic acids in the fluorine-containing polymer. Alternatively, the amine may be introduced into the anti-reflective coating composition by mixing the amine with the fluorine-containing polymer in, for example, an aqueous solution to prepare previously an aqueous solution of an amine salt (of course including ammonium salt in the present invention) of the fluorine-containing polymer, and using this aqueous solution as a material for producing the anti-reflective coating composition. Of course, it is possible to add the amine together with the fluorine-containing polymer and an acid upon preparation of the composition to incorporate thereby the amine in the composition. In this occasion, the ratio of the acid group such as carboxylic acid of the fluorine-containing polymer to the amine is preferably in the range of 1:0.6 to 1:1.2, more preferably 1:0.7 to 1:1.1, in terms of chemical equivalent weight ratio.

The anti-reflective coating composition of the present invention enables to obtain a resist pattern having a good dimensional accuracy since amplitude width of the resist film thickness vs. sensitivity curve is reduced and the standing wave due to interference between an incident light and a reflected light or between reflected lights is reduced based on the anti-reflecting function of the coating composition as with the conventional compositions and, in addition, enables to adjust the amount of reduction in thickness of the photoresist film upon development. In this occasion, it is preferred to optimize the amount of reduction in thickness of the photoresist film upon development by adjusting the acidity of the composition in consideration of the kind of photoresist to be used (for example, chemically amplified photoresist) or process conditions, through adjustment of mixing ratio of the above-mentioned fluorine-containing polymer, amine, and acid. That is, the present invention enables to attain an intentional reduction amount of the photoresist film at its surface layer by adjustment of acidity of the anti-reflective coating composition. Thus, the surface portion of the resist film, which is considered to cause formation of unfavorable T-top or round top shape due to, for example, intermixing between the anti-reflective film and the photoresist film at the interface thereof, can be removed with an optimal thickness upon development and, after development, there can be formed a resist pattern having a rectangular and good shape.

As is described hereinbefore, an optimal result can be obtained by adjusting the amount of reduction in thickness of the resist film upon development through proper selection of the mixing ratio of the fluorine-containing polymer, amine and acid depending upon the kind of photoresist to be used (such as chemically amplified photoresist) or upon process conditions to adjust properly pH of the composition thereby. In the present invention, it is preferred to adjust the pH of the composition to 7 or less by mixing the fluorine-containing polymer with the amine to convert the fluorine-containing polymer to its amine salt, and mixing this salt with an acid in an aqueous solution or an aqueous solvent. As the anti-reflective coating composition to be used for a positive-working chemically amplified photoresist, the weight ratio of the amine salt of the fluorine-containing polymer to the acid is preferably 1:0.01 to 1:0.5, more preferably 1:0.01 to 1:0.3. In this occasion, the chemical equivalent ratio of the sum of the acid group, such as carboxylic acid, of the fluorine-containing polymer and the organic or inorganic acid to be added to the amine is in the range of preferably 1:0.5 to 1:1.0, whereby pH of the composition can be controlled to the afore-mentioned proper pH range.

In addition, the chemically amplified photoresists involve the problem of PED (Post Exposure Delay). That is, in the case of positive-working photoresists, when the photoresist-leaving time of from the exposure to PEB (Post Exposure Bake) is prolonged, the deactivation amount of the acid generated on the surface of the resist by exposure increases due to a basic compound in the air. It may be considered that this leads to difficult decomposition of the protective group of the chemically amplified resists and, in the case of forming a pattern, there arises the problem that there results a T-topped line pattern. However, deterioration of the pattern shape due to PED can be prevented by applying the anti-reflective coating composition of the present invention. That is, the anti-reflective coating composition of the present invention also functions as a protective film and, thus, the anti-reflective coating composition of the present invention includes an embodiment of being used as a protective film.

Further, as the aqueous solvent to be used in the anti-reflective coating composition of the present invention, water is preferred. As the water, water from which organic impurities and metal ions are removed by distillation, ion-exchange treatment, filter treatment or various adsorption treatments is preferred.

Additionally, it is possible to use a water-soluble organic solvent together with water for the purpose of improving coating properties of the anti-reflective coating composition. As the water-soluble organic solvent, any solvent may be used that dissolves in water in a concentration of 0.1% by weight or more, and there are illustrated, for example, alcohols such as methyl alcohol, ethyl alcohol and isopropyl alcohol, ketones such as acetone and methyl ethyl ketone, esters such as methyl acetate, ethyl acetate and ethyl lactate, and polar solvents such as dimethylformamide, dimethylsulfoxide, methyl cellosolve, cellosolve, butyl cellosolve, cellosolve acetate, alkylcellosolve acetate, butylcarbitol and carbitol acetate. These specific examples are illustrated merely as examples of the organic solvents, and do not limit the organic solvents to be used in the present invention in any way.

In the anti-reflective coating composition of the present invention maybe compounded, if necessary, a water-soluble resin within a range of not spoiling the performance of the composition. Examples of the water-soluble resin to be used in the anti-reflective coating composition of the present invention include polyvinyl alcohol, polyacrylic acid, polyvinylpyrrolidone, poly-α-trifluoromethylacrylic acid, poly (vinyl methyl ether-co-maleic anhydride), poly(ethylene glycol-co-propylene glycol), poly(N-vinylpyrrolidone-co-vinyl acetate), poly(N-vinylpyrrolidone-co-vinyl alcohol), poly(N-vinylpyrrolidone-co-acrylic acid), poly(N-vinylpyrrolidone-co-methyl acrylate), poly(N-vinylpyrrolidone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly(N-vinylpyrrolidone-co-maleic anhydride), poly(N-vinylpyrrolidone-co-itaconic acid), poly(N-vinylpyrrolidone-co-methyl itaconate), poly(N-vinylpyrrolidone-co-itaconic anhydride) and fluorinated polyether. Of these resins, polyacrylic acid, polyvinylpyrrolidone and fluorinated polyether are particularly preferred.

Also, in the anti-reflective coating composition of the present invention may be compounded, as needed, other additives than the water-soluble resin within a range of not spoiling the performance of the composition. Examples of such additives include surfactants such as nonionic surfactants, anionic surfactants and amphoteric surfactants to be added for the purpose of improving coating properties. Examples of the nonionic surfactants include polyoxyethylene alkyl ethers such as polyoxyethylene lauryl ether, polyoxyethylene oleyl ether and polyoxyethylene cetyl ether, polyoxyethylene fatty acid diesters, polyoxyethylene fatty acid monoesters, polyoxyethylene/polyoxypropylene block polymers and acetylene glycol derivatives. Examples of the anionic surfactants include alkyl diphenyl ether disulfonic acids and the ammonium salts or the organic amine salts thereof, alkyl diphenyl ether sulfonic acids and the ammonium salts or the organic amine salts thereof, alkylbenzenesulfonic acids and the ammonium salts or the organic amine salts thereof, polyoxyethylene alkyl ether sulfuric acids and the ammonium salts or the organic amine salts thereof and alkylsulfuric acids and the ammonium salts or the organic amine salts thereof. Examples of the amphoteric surfactants include 2-alkyl-N-carboxymethyl-N-hydroxyethylimidazolinium betaine and laurylamidopropylhydroxysulfon betaine.

Also, in the present invention, optimization of the amount of reduction in thickness of the film may be conducted by adjusting the temperature or the period of baking the photoresist and the anti-reflective coating composition as well as by adjusting through the anti-reflective coating composition. As to the pre-baking temperature for the photoresist, there are generally two types depending upon the formulation of the composition. That is, one type requires a high energy and generally requires to bake at a temperature of about 100° C. to about 150° C., and the other type requires a less energy than the aforesaid type and requires to bake at a temperature of 100° C. or less. A pre-baking temperature for the anti-reflective coating composition is generally 60° C. to 100° C. which is enough to remove the solvent used. Further, post-exposure baking of the photoresist is conducted at a temperature of generally about 100° C. to about 150° C. For example, in the case of preventing formation of T-top shape in a developed pattern, it can be realized in some cases by properly combining the baking temperature for the photoresist and the baking temperature for the anti-reflective coating composition such that the pre-baking temperature for the photoresist is set at a lower level and the pre-baking temperature for the anti-reflective coating composition at a higher level of 100° C. or more. Also, it is possible to peel off or dissolve away the anti-reflective coating composition, as needed, after exposure to reduce thereby the amount of reduction in thickness of the resist film to avoid disadvantages in the etching step.

The film thickness of the anti-reflective coating composition of the present invention is preferably a thickness which provides an enough chemical action to attain a larger amount of reduction in thickness of the photoresist film upon development in comparison with the case of not applying the anti-reflective coating composition and which, in view of anti-reflecting function, satisfies the afore-mentioned formulae 1 and 2 as much as possible. The film thickness is preferably 80 to 10,000 Å, more preferably 330 Å to 990 Å. Also, application of the anti-reflective coating composition can be conducted by any of conventionally known coating methods such as a spin costing method.1

The pattern-forming method of the present invention is not different from the conventionally known methods for forming a resist pattern except for applying the anti-reflective coating composition of the present invention and adding, as needed, a heating step. To describe one example thereof taking the case of using a positive-working chemically amplified photoresist for instance, a photoresist is first coated on a substrate such as a silicon wafer and conducting, if necessary, pre-baking (for example, at a baking temperature of 70° C. to 150° C. for about 1 minute) to form thereby a photoresist film on the substrate, the anti-reflective coating composition is applied on the photoresist film and is heated, if necessary, to form the anti-reflective coating film. This is then exposed using a reduction projector for exposure such as a stepper and is subjected, as needed, to PEB (for example, at a baking temperature of 50° C. to 150° C.), followed by post-development baking (for example, at a baking temperature of 60° C. to 120° C.) to form a resist pattern, if necessary.

In the pattern-forming method of the present invention, any photoresist that has conventionally been known as a photoresist may be used, and a positive-working chemically amplified photoresist is preferred. As the positive-working chemically amplified resist to be preferably used in the pattern-forming method of the present invention, any of known positive-working chemically amplified photoresists may be used. As the positive-working chemically amplified photoresists, there have been known various ones such as a photoresist comprising a combination of t-butoxycarbonyl group-protected polyhydroxystyrene and a photo acid generator (see, H. Ito & C. G. Willson; Polym. Eng. Sci., 23, 1012(1983)) and a photoresist comprising a combination of triphenylsulfonium hexafluoroarsenate and poly(p-tert-butoxycarbonyloxy-α-methylstyrene) described in JP-A-2-27660. The thickness of the photoresist film may be such that a resist pattern obtained after development can properly be adapted for etching in the etching step, and is generally about 0.3 μm to about 1.0 μm.

Also, the pattern-forming method of the present invention may be suitably applied not only to commonly used substrates of 6 or thereabout inches in diameter but to large-sized substrates of 8 inches or more in diameter as well. As the substrate on which the photoresist film and the anti-reflective film are formed, silicon substrates are common, but those which comprise a silicon plate having provided thereon a metal film, an oxide film such as a metal oxide film or a silicon oxide film, a nitride film such as a silicon nitride film, a silicon oxide nitride film or a polysilicon film and, further, those which have a circuit pattern or semiconductor elements may be used. The material for the substrate itself is not limited to silicon, and any of substrate materials that have conventionally been used for manufacturing IC such as LSI may be used.

Also, as to application of the positive-working chemically amplified photoresist, baking and exposing methods for the positive-working chemically amplified photoresist film and the anti-reflective coating composition film, developers and developing methods, any of those materials or conditions that have conventionally been employed for forming a resist pattern using a positive-working chemically amplified photoresist may be used. For example, as a method for applying the photoresist, any method such as a spin-coating method, a roll-coating method, a land-coating method, a cast-coating method or a dip-coating method may be employed. Further, as an exposing light source to be used in the exposing step, any light source such as UV rays, deep-UV rays such as KrF excimer laser or ArF excimer laser, X rays or electron beams may be used. As the developers, any of those which can develop a photoresist to be used may be used. For example, a developer composed of an aqueous solution of alkali such as tetramethylammonium hydroxide may be used. Further, development may be effected according to those methods which have conventionally been employed for developing a photoresist. Additionally, the anti-reflective coating composition of the present invention is preferably dissolved away with an alkaline developer upon development of the photoresist film.

BEST MODE FOR CARRYING OUT THE INVENTION

The present invention is now described more specifically by reference to Examples which, of course, do not limit the invention in any way.

EXAMPLE 1

2.94 parts by weight of a fluorine-containing polymer having a number-average molecular weight of 4700 and a weight-average molecular weight of 6300 as determined using polystyrene standards and represented by the following general formula (III):

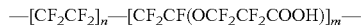

$$-[CF_2CF_2]_n-[CF_2CF(OCF_2CF_2COOH)]_m-  \quad (III)$$

wherein n:m=1:1 was dispersed in 96 parts by weight of water at an ordinary temperature to prepare slurry, then 0.56 part by weight of tetramethylammonium hydroxide (TMAH) was gradually added thereto (the chemical equivalent ratio of carboxylic acid of the fluorine-containing polymer to TMAH being 1:0.7) to prepare an aqueous solution containing 3.5 parts by weight of a TMAH salt of the fluorine-containing polymer. Further, 0.5 part by weight of dodecylbenzenesulfonic acid was added thereto to prepare a total weight of 100 parts by weight of a uniform aqueous solution. The resultant uniform aqueous solution was filtered through a 0.1-μm filter to obtain an anti-reflective coating composition. This anti-reflective coating composition had a pH of about 2.4.

Separately, a positive-working photoresist, AZ DX3301P ("AZ" being a registered trademark), comprising an acetal type polymer and made by Clariant (Japan) K.K. was coated on a silicon wafer using a spin coater (Mark 8) made by Tokyo Electron Co., Ltd., followed by pre-baking on a hot plate at 90° C. for 90 seconds to form a 510-nm photoresist film on the silicon wafer. The thickness of the film was measured by means of a film thickness-measuring apparatus (SM300) made by Prometric Co.

Subsequently, the above-described anti-reflective coating composition was applied on the photoresist film using the same spin coater, followed by pre-baking on a hot plate at 90° C. for 60 seconds to form a 450-Å thick anti-reflective coating film. Next, exposure was conducted using a KrF reduction projector for exposure (FPA 3000-EX5) made by Canon Co., Ltd. and, after conducting PEB on a hot plate at 110° C. for 60 seconds, paddle development was conducted using an alkaline developer, AZ 300MIF developer ("AZ" being a registered trademark; a 2.38% by weight aqueous solution of tetramethylammonium hydroxide), made by Clariant (Japan) K.K. as a developer at 23° C. for 1 minute to obtain a resist pattern. The thickness of the developed resist was measured using the same film thickness-measuring apparatus as described above.

The value of film thickness of the thus-obtained resist after development was subtracted from the value of film thickness of the resist before development, and the remainder value was taken as the amount of reduction in thickness of the film.

Also, the cross sectional pattern shape of the thus-formed resist was observed by means of a scanning type electron microscope (SEM).

The observed cross sectional pattern shape of the resist, the amount of reduction in thickness of the photoresist film, pH of the anti-reflective coating composition, and the refractive index of the anti-reflective film at a wavelength of 248 nm are shown in the following Table 1.

EXAMPLES 2 TO 4

The results shown in the following Table 1 were obtained by conducting the same procedures as in Example 1 except for changing the amount (parts by weight) of dodecylbenzenesulfonic acid used and reducing the amount of water enough to cancel off the increased amount of dodecylbenzenesulfonic acid.

TABLE 1(A)

| | Amine salt of fluorine-containing polymer | Dodecylbenzene-sulfonic acid | Thickness of resist (Å) | Reduction amount of resist film (Å) |
|---|---|---|---|---|
| Ex. 1 | 3.5 | 0.5 | 5105.7 | 210.8 |
| Ex. 2 | 3.5 | 0.5 | 5110.3 | 223.0 |
| Ex. 3 | 3.5 | 0.5 | 5112.7 | 241.4 |
| Ex. 4 | 3.5 | 0.5 | 5115.5 | 258.6 |

TABLE 1(B)

| | pH | Refractive index | Pattern shape |
|---|---|---|---|
| Ex. 1 | 2.4 | 1.44 | Rectangular |
| Ex. 2 | 2.3 | 1.44 | Rectangular |
| Ex. 3 | 2.3 | 1.44 | Rectangular |
| Ex. 4 | 2.2 | 1.44 | Rectangular |

EXAMPLE 5

The results shown in the following Table 2 were obtained by conducting the same procedures as in Example 1 except for changing the chemical equivalent ratio of carboxylic acid of the fluorine-containing polymer used in Example 1 to the amine to 1:1.1 and mixing the fluorine-containing polymer with the amine in amounts so that 3.5 parts by weight of the amine salt of the fluorine-containing polymer was formed.

EXAMPLE 6

The results shown in the following Table 2 were obtained by conducting the same procedures as in Example 5 except for changing the amount (parts by weight) of dodecylbenzenesulfonic acid as shown in Table 2 and increasing the amount of water enough to cancel off the decreased amount of dodecylbenzenesulfonic acid.

TABLE 2(A)

| Amine salt of fluorine- | | Thickness | Reduction amount of resist |

|  | containing polymer | Dodecylbenzene-sulfonic acid | of resist (Å) | film (Å) |
|---|---|---|---|---|
| Ex. 5 | 3.5 | 0.5 | 5103.8 | 135.0 |
| Ex. 6 | 3.5 | 0.3 | 5106.9 | 105.9 |

TABLE 2(B)

|  | pH | Refractive index | Pattern shape |
|---|---|---|---|
| Ex. 5 | 6.0 | 1.48 | Nearly rectangular |
| Ex. 6 | 7.0 | 1.48 | Nearly rectangular |

EXAMPLE 7

The results shown in the following Table 3 were obtained by conducting the same procedures as in Example 1 except for changing dodecylbenzenesulfonic acid to 0.07 part by weight of sulfuric acid and using as a surfactant 0.05 part by weight of Acetylenol EL made by Kawaken Fine Chemical Co., Ltd.

EXAMPLE 8

The results shown in the following Table 3 were obtained by conducting the same procedures as in Example 7 except for changing the amount of sulfuric acid to 0.14 part by weight.

TABLE 3(A)

|  | Amine salt of fluorine-containing polymer | Sulfuric acid | Thickness of resist (Å) | Reduction amount of resist film (Å) |
|---|---|---|---|---|
| Ex. 7 | 3.5 | 0.07 | 5110.5 | 169.7 |
| Ex. 8 | 3.5 | 0.14 | 5113.6 | 208.5 |

TABLE 3(B)

|  | pH | Refractive index | Pattern shape |
|---|---|---|---|
| Ex. 7 | 2.2 | 1.42 | rectangular |
| Ex. 8 | 2.1 | 1.43 | rectangular |

COMPARATIVE EXAMPLE 1

An anti-reflective coating composition was obtained in the same manner as in Example 1 except for changing the chemical equivalent ratio of carboxylic acid of the fluorine-containing polymer to TMAH to 1:1.3 and mixing the fluorine-containing polymer with TMAH in amounts so that 3.5 parts by weight of the tetramethylammonium salt of the fluorine-containing polymer was formed, using 96.5 parts by weight of water and not using dodecylbenzenesulfonic acid. This anti-reflective coating composition had a pH of about 11.0. This anti-reflective coating composition was coated on a resist film to form a resist pattern in the same manner as in Example 1. Measurement of the film thickness of the resist, the amount of reduction in thickness of the film and the refractive index of the anti-reflective film and observation of the pattern shape were conducted in the same manner as in Example 1 to obtain the results tabulated in the following Table 4.

TABLE 4(A)

|  | Amine salt of fluorine-containing polymer | Acid | Thickness of resist (Å) | Reduction amount of resist film (Å) |
|---|---|---|---|---|
| Comparative Example 1 | 3.5 | — | 5114.1 | 87.2 |

TABLE 4(B)

|  | pH | Refractive index | Pattern shape |
|---|---|---|---|
| Comparative Example 1 | 11.0 | 1.44 | T-top |

As is apparent from the above Tables 1, 2 and 3, the amount of reduction in thickness of the photoresist film can be controlled by properly adjusting the mixing amounts of the fluorine-containing polymer, the amine and the acid to adjust pH and use the mixture as an acidic composition, which leads to formation of a resist pattern having a rectangular shape. Also, by using the anti-reflective coating composition having a lower refractive index than that of the photoresist material, deterioration of dimensional accuracy of the pattern (variation of pattern width) to be caused due to interference within the photoresist film with a reflected light from the substrate can be prevented.

ADVANTAGES OF THE INVENTION

As has been described in detail hereinbefore, the anti-reflective coating composition of the present invention can prevent deterioration of dimensional accuracy of the pattern (variation of pattern width) to be caused due to interference within the photoresist film with a reflected light from the substrate, and can form a resist pattern without causing deterioration of the pattern shape such as T-top or round top to be caused due to intermixing of a chemically amplified photoresist with the anti-reflective coating film, which is disadvantageous in the etching step. In addition, the present invention can provide a PFAS-free anti-reflective coating composition.

INDUSTRIAL APPLICABILITY

The anti-reflective coating composition of the present invention is preferably used as an anti-reflective film-forming material upon formation of a resist pattern in manufacturing semiconductor elements such as LSI.

What is claimed is:

1. An anti-reflective coating composition which comprises a fluorine-containing polymer, an acid, an amine and an aqueous solvent capable of dissolving these components, further where the coating composition has a pH ranging from about 1.0 to about 6.0, and further where the fluorine-containing polymer is a polymer comprising a polymer unit represented by the following general formula (I),

   (I)

wherein $R_f$ represents a straight or branched perfluoroalkyl group which may contain an etheric oxygen atom, further wherein the acid is at least one member selected from the group consisting of sulfuric acid, hydrochloric acid, nitric acid, phosphoric acid, hydrofluoric acid, hydrobromic acid, alkylsulfonic acid, alkylbenzenesulfonic acid, alkylcarboxylic acid, alkylbenzenecarboxylic acid, and those obtained by replacing all or part of the hydrogen atoms of the aforesaid alkyl group by fluorine atoms, and further where alkyl of the acid is 1 to 20 carbon atoms and the acid is in the amount of 0.1% by total weight to 2.0% by total weight.

2. The anti-reflective coating composition as described in claim 1, wherein the fluorine-containing polymer further comprises a unit represented by the following general formula (II):

—[$CF_2CFX$]— (II)

wherein X represents a fluorine atom or a chlorine atom.

3. The anti-reflective coating composition as described in claim 1, wherein the amine is at least one member selected from the group consisting of $NH_3$, $N(CH_3)_4OH$, alkanolamine, alkylamine and aromatic amine.

4. The anti-reflective coating composition as described in claim 1, wherein the aqueous solvent is water.

5. A pattern-forming method which includes a step of applying the anti-reflective coating composition of claim 1 on a photoresist film and, if necessary, a heating step.

6. The anti-reflective coating composition as described in claim 1, where the coating composition has a pH ranging from about 1.0 to about 4.0.

7. The anti-reflective coating composition as described in claim 1, where the coating composition has a pH ranging from about 1.6 to about 2.6.

8. The anti-reflective coating composition as described in claim 2, where the coating composition has a pH ranging from about 1.0 to about 6.0.

9. The anti-reflective coating composition as described in claim 2, where the coating composition has a pH ranging from about 1.0 to about 4.0.

10. The anti-reflective coating composition as described in claim 2, where the coating composition has a pH ranging from about 1.6 to about 2.6.

11. The anti-reflective coating composition according to claim 1, wherein the acid is dodecylbenzenesulfonic acid.

* * * * *